US007120407B2

(12) United States Patent
Miyagi

(10) Patent No.: US 7,120,407 B2
(45) Date of Patent: Oct. 10, 2006

(54) RECEIVER AND ITS TRACKING ADJUSTING METHOD

(75) Inventor: Hiroshi Miyagi, Jouetsu (JP)

(73) Assignee: Niigata Seimitsu Co., Ltd., Niigata (JP)

( * ) Notice: Subject to any disclaimer, the term of this patent is extended or adjusted under 35 U.S.C. 154(b) by 116 days.

(21) Appl. No.: 10/494,654

(22) PCT Filed: Nov. 16, 2001

(86) PCT No.: PCT/JP01/10039

§ 371 (c)(1),
(2), (4) Date: May 4, 2004

(87) PCT Pub. No.: WO03/043212

PCT Pub. Date: May 22, 2003

(65) Prior Publication Data

US 2005/0003780 A1 Jan. 6, 2005

(51) Int. Cl.
*H04B 1/18* (2006.01)

(52) U.S. Cl. .............................. 455/169.1; 455/173.1; 455/178.1; 455/182.1; 455/191.1

(58) Field of Classification Search ............ 455/169.1, 455/173.1, 178.1, 182.1, 191.1, 193.1, 192.3, 455/209

See application file for complete search history.

(56) References Cited

U.S. PATENT DOCUMENTS 3,310,745 A * 3/1967 Deasy et al. ................ 455/203
4,858,006 A * 8/1989 Suzuki et al. ............... 348/189
5,428,829 A 6/1995 Osburn et al.
6,211,925 B1 * 4/2001 Kikuchi ...................... 348/729
6,505,038 B1 * 1/2003 Peusens et al. ............ 455/310

FOREIGN PATENT DOCUMENTS

| | | | |
|---|---|---|---|
| JP | 59-078730 | | 5/1984 |
| JP | 7-500718 | | 1/1995 |
| JP | 10-051345 | | 2/1998 |
| JP | 2000-165279 | | 6/2000 |
| WO | WO9406208 | * | 3/1994 |

* cited by examiner

*Primary Examiner*—Matthew D. Anderson
*Assistant Examiner*—Tuan Pham
(74) *Attorney, Agent, or Firm*—patenttm.us; James H. Walters

(57) ABSTRACT

A receiver such that the period required for tracking adjustment, temperature compensation is not needed, and tracking errors due to fluctuation of the power supply voltage are prevented from increasing, and a tracking adjusting method for the receiver. A DAC 4 generates a voltage according to the value of data (Do) inputted from an MPU 81 by using a control voltage outputted from a low-pass filter 35 in a local oscillator 3 as a reference voltage used during digital-analog conversion. A multiplier circuit 5 analog-multiplies the output voltage of the DAC 4 by a predetermined multiplier. The output voltage of the multiplier circuit 5 is applied as a tuning voltage to a high-frequency tuning circuit 20. In an EEPROM 84 stored is the value of the input data (Do) of the DAC 4 which has been measured in advance and corresponds to the tuned voltage of when the tracking error is the minimum at the central value of the local oscillation frequency, and the MPU 81 reads the data (Do) from the EEPROM 84 and inputs it to the DAC 4.

4 Claims, 6 Drawing Sheets

F/G. 1
TEST SIGNAL GENERATOR
DISTORTION METER
LEVEL METER
PC
I/F
OPERATION SECTION
EEP ROM
MPU
INTERMEDIATE FREQUENCY AMPLIFIER CIRCUIT
DETECTION CIRCUIT
MIXING CIRCUIT
PHASE COMPARATOR
REFERENCE SIGNAL GENERATOR
FREQUENCY DIVIDER
LPF
AMPLIFIER
VCO
MULTIPLIER CIRCUIT
MULTIPLIER CIRCUIT
DAC
DAC
1
2
3
4
5
6
7
8
9
10
11
12
13
14
20
22
24
31
32
33
34
35
81
82
83
84
91
92
100
120
122
126
128

RECEIVER AND ITS TRACKING ADJUSTING METHOD

TECHNICAL FIELD

The present invention relates to a receiver which adopts a superheterodyne system, and its tracking adjusting method.

BACKGROUND ART

Generally, in receivers which receive broadcast waves such as AM broadcast and FM broadcast, a superheterodyne system is adopted as a receiving system. The superheterodyne system is a receiving system which converts a received broadcast signal into an intermediate frequency signal, which has a fixed frequency independent of an frequency of a received signal (receive frequency), by mixing a predetermined local oscillation signal to the received broadcast signal, and reproduces a sound signal by performing detection processing, amplification, etc. after that, and has a feature that it is superior to other receiving systems in sensitivity, selectivity, etc.

FIG. 8 is a diagram showing the structure of a conventional receiver which adopts the superheterodyne system. The conventional receiver shown in this diagram is constituted by including an antenna 200, a high frequency receiving circuit 202, a local oscillator 204, a mixing circuit 206, an intermediate frequency amplifier circuit 208, an MPU 210, memory 212, a control unit 214, and a digital-to-analog converter (DAC) 216.

In the conventional receiver, data showing the relation between a tuned voltage applied to the high frequency receiving circuit 202 and a received frequency is stored in the memory 212. The MPU 210 calculates data necessary for generating a tuned voltage on the basis of the data stored in the memory 212 to input it into the DAC 216. The tuned voltage which has a desired value is generated by this DAC 216, and is applied to the high-frequency tuning circuit 202.

FIG. 9 is a graph showing the contents of the data stored in the memory 212. As shown in this graph, let a variable range of the received frequency be $f_0$ to $f_5$, and in this variable range, for example, tuned voltages $V_0$, $V_1$, $V_2$, $V_3$, $V_4$, and $V_5$ corresponding to some received frequencies $f_0$, $f_1$, $f_2$, $f_3$, $f_4$, and $f_5$ are measured beforehand, and input data to the DAC 216 necessary for generating these plural tuned voltages is stored in the memory 212. Then, in the case of setting the received frequency of the high frequency receiving circuit 202 as a value other than $f_0$, $f_1$, $f_2$, $f_3$, $f_4$, and $f_5$ which are mentioned above, the MPU 210 obtains input data necessary for generating a desired received frequency by reading the input data of the DAC 216 corresponding to two received frequencies in the vicinity of it from the memory 212 and performing linear interpolating operation to input this into the DAC 216. Thus, a predetermined tuned voltage is applied to the high frequency receiving circuit 202 from the DAC 216, and the desired received frequency is set.

By the way, in the case of setting a tuning frequency of the high frequency receiving circuit 202 with interlocking with an oscillation frequency of the local oscillator 204 by using the conventional system mentioned above, there have been problems: (1) a tracking adjustment takes time, (2) temperature compensation is difficult, and (3) it is weak to the fluctuation of a supply voltage.

As mentioned above, in order to set a suitable tuned voltage by using the DAC 216, it is necessary to perform the tracking adjustment of measuring beforehand a plurality of tuned voltages $V_0$, $V_1$, $V_2$, $V_3$, $V_4$, and $V_5$ as shown in FIG. 9. For example, to measure a tuned voltage $V_0$ is to obtain the tuned voltage $V_0$ at which a tracking error becomes at a minimum, by changing a value of input data of the DAC 216 in the state of outputting a local oscillation signal at a frequency corresponding to the tuning frequency $f_0$ from the local oscillator 204. Usually, it is measured by using a distortion meter and a level meter whether a tracking error is at a minimum, and the distortion rate measurement using the distortion meter takes time of about 10 to 20 seconds for waiting for the stability of an output value. Since such measurement is required every tuned voltage, it takes much time for the tracking adjustment.

In addition, generally in the high frequency receiving circuit 202, since characteristics of devices used change with temperature, a tuning frequency changes with temperature even if a tuned voltage outputted from the DAC 216 is constant. On the other hand, since the local oscillator 204 generally has the phase synchronous loop (PLL) structure of including a voltage controlled oscillator and a variable frequency divider, the frequency of a local oscillation signal determined by a division ratio of the variable frequency divider does not change even if characteristics of devices used change with temperature. Thus, since only the tuning frequency changes with interlocking with a temperature change but the frequency of the local oscillation signal does not change, a tracking error increases in connection with the temperature change. Although it is necessary to equip with a temperature compensation circuit newly in order to avoid such inconvenience, it is not easy to prevent the increase of the tracking error by performing temperature compensation over the entire range of the tuning frequency, and further, there newly arises a problem that a circuit scale become large.

Furthermore, when a supply voltage of the receiver shown in FIG. 8 fluctuates, for example, when a drive voltage drops in a pocket receiver driven by a battery, a car radio driven by an vehicle-mounted battery, or the like, an output voltage of the DAC 216 becomes low with interlocking with the drop of the supply voltage, and hence, a tracking error becomes large since a tuned voltage drops even if the MPU 210 intends to set a desired tuning frequency.

DISCLOSURE OF THE INVENTION

The present invention is created in view of such points, and aims at providing a receiver and its tracking adjusting method which can shorten the time required for tracking adjustment, does not require temperature compensation, and can prevent a tracking error from increasing because of the fluctuation of a supply voltage.

In order to solve the issues mentioned above, the receiver of the present invention comprises a high frequency receiving circuit, a local oscillator, a mixing circuit, an offset circuit, and a multiplier circuit. The high frequency receiving circuit receives a broadcast wave at a received frequency according to a tuned voltage. The local oscillator generates a local oscillation signal at a frequency according to a control voltage. The mixing circuit mixes the signal, which is outputted from the high frequency receiving circuit, and local oscillation signal, and outputs an intermediate frequency signal corresponding to a differential frequency thereof. The offset circuit sets a predetermined offset voltage to a control voltage. The multiplier circuit performs the analog multiplication of a predetermined multiplier to the control voltage. By such structure, the receiving circuit of the present invention applies a voltage, which is the control voltage passed through the offset circuit and multiplier circuit, as a tuned voltage to the high frequency receiving circuit.

Since the tuned voltage is generated on the basis of the control voltage, it is not necessary to obtain a plurality of tuned voltages, at which a tracking error becomes at a minimum, by measurement like a conventional receiver using a digital-to-analog converter, and hence, it is possible to shorten the time necessary for tracking adjustment.

In addition, it is desirable to set the above-mentioned multiplier of the multiplier circuit on the basis of a variable range of a frequency of a local oscillation signal generated by the local oscillator and a variable range of a received frequency of the high frequency receiving circuit. Since a center frequency of the variable range of the local oscillation signal and a center frequency of the variable range of the received frequency of the high frequency receiving circuit shifts by the intermediate frequency, even if respective variable widths are made equal, the variable width of the control voltage and the variable width of the tuned voltage which correspond to these variable ranges do not become equal, but, by analog-multiplying the control voltage by the predetermined multiplier, it becomes possible to make the difference between the variable widths of these respective voltages coincide.

In addition, it is desirable to set an offset voltage by achieving the above-mentioned offset circuit by the digital-to-analog converter using the control voltage as a reference voltage, and adjusting input data. Since it is possible to make a value of the offset voltage variable by adjusting a value of digital input data, it becomes possible to adjust the offset voltage by using a processor etc., and hence, it is possible to reduce the effort and time which is necessary for the setting of the offset voltage. In addition, since the value of the tuned voltage applied to the high frequency receiving circuit is also interlocked and is fluctuated with the control voltage when ambient temperature changes and the value of the control voltage is fluctuated, it becomes possible to perform temperature compensation only by making the high frequency receiving circuit and local oscillator in similar structure, and hence, temperature compensation by a complicated circuit becomes unnecessary.

In addition, it is desirable to set the above-mentioned offset voltage so that a tracking error may become at a minimum when setting a frequency of the local oscillation signal at an arbitrary value included in its variable range. It is possible to shorten the time necessary for tracking adjustment by reducing the number of times of this adjustment by using a distortion meter etc.

Furthermore, it is desirable to prepare a plurality of values which is changeable according to a frequency of the local oscillation signal, and to set the offset voltage so that a tracking error corresponding to the entire area of the variable range of the frequency of the local oscillation signal may become a predetermined value or less. Although optimal tracking adjustment in the central value of the variable frequency range of the local oscillation signal is performed and a predetermined offset voltage corresponding to the frequency range in this vicinity is set, there is a tendency that a tracking error becomes large as the frequency of the local oscillation signal shifts from this central value. For this reason, it is possible to easily lessen a tracking error in the entire area of the variable frequency range by dividing the entire area of the variable frequency range of the local oscillation signal into a plurality of areas, setting the offset voltage which has a different value every divided area, and switching the offset voltage every divided area.

Moreover, it is desirable to comprise memory, which stores input data necessary for the generation of the offset voltage set so that a tracking error corresponding to the entire area of the variable range of the frequency of the local oscillation signal mentioned above may become a predetermined value or less, and a voltage value setting unit which sets a value of the offset voltage corresponding to the frequency of the local oscillation signal by reading input data, stored in this memory, and inputting it into the digital-to-analog converter. Since it is possible to generate an optimal offset voltage by reading input data stored in the memory and inputting it into the digital-to-analog converter, it becomes easy to set an offset voltage after the optimal adjustment is performed.

In addition, in a tracking adjusting method of the receiver of the present invention, while setting a received frequency of the receiver at an arbitrary value included in its variable range at a first step, a predetermined test signal having the same frequency as the received frequency at this time is inputted into the high frequency receiving circuit. At a second step, a value of the offset voltage set by the offset circuit is set so that a tracking error of the receiver after various kinds of settings being performed at the first step may become at a minimum. Since measurement of a tracking error is executed in an arbitrary value included in the variable range of a received frequency, it is possible to shorten the time necessary for the tracking adjustment by reducing the number of times of this measurement.

Furthermore, it is desirable to have a third step of changing and setting a value of the offset voltage in regard to some frequency band in which these upper limit or lower limit is included when a tracking error near the upper limit or lower limit of the variable range of the received frequency is large after the above-mentioned second step. Although there is also the case that a tracking error in the entire received band does not become a predetermined value or less only by the tracking adjustment at one point of an arbitrary value, it is possible to easily suppress the tracking error in the entire received band within a predetermined tolerance by changing a value of the offset voltage corresponding to some frequency band containing the upper limit or lower limit of the received frequency where the tracking error becomes large.

Moreover, in a tracking adjusting method of the receiver of the present invention, while setting a received frequency of the receiver at an arbitrary value included in its variable range at a fourth step, a predetermined test signal having the same frequency as the received frequency at this time is inputted into the receiver. At a fifth step, input data of the digital-to-analog converter is set so that a tracking error of the receiver after various kinds of settings being performed at the fourth step may become at a minimum. In the sixth step, the input data set in the fifth step is stored in the memory. Since the measurement of a tracking error is executed in an arbitrary value included in the variable range of a received frequency, it is possible to shorten the time necessary for the tracking adjustment by reducing the number of times of this measurement. In addition, since the result of tracking adjustment is stored in the memory, the storage and subsequent utilization of this resultant data become easy.

Furthermore, it is desirable to have after the above-mentioned sixth step a seventh step of changing and setting contents of input data of the digital-to-analog converter in regard to some frequency band in which the upper limit or lower limit is included when a tracking error near these upper limit or lower limit of the variable range is large, and an eighth step of storing in the memory the input data of the digital-to-analog converter after the change set at this seventh step. Although it is necessary to set a plurality of offset voltages which has different values if it is not possible to suppress the tracking error to a predetermined permissible value or less only by setting the offset voltage which has a common value in the entire receiving band, the storage and utilization of resultant data of the tracking adjustment become easy since what is necessary is just to store the data, corresponding to the values of the plurality of offset voltages, in the memory even if it is such a case.

BEST MODE FOR CARRYING OUT THE INVENTION

Hereafter, an FM receiver according to an embodiment where the present invention is applied will be described with referring to drawings.

Figure 1:
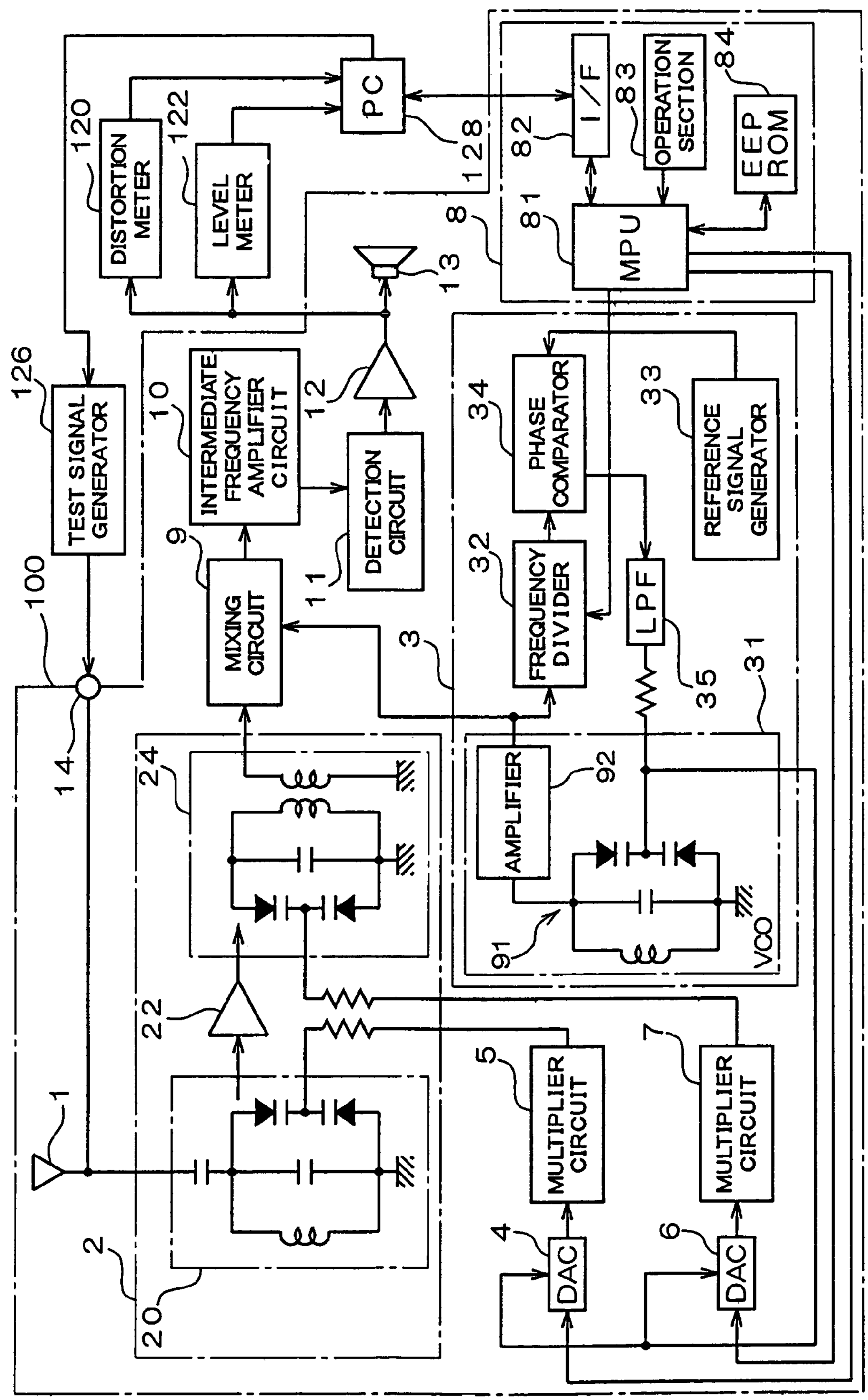
FIG. 1 is a diagram showing the structure of an FM receiver of an embodiment.

FIG. 1 is a diagram showing the structure of an FM receiver of this embodiment. An FM receiver 100 shown in this diagram is constituted by including an antenna 1, an high frequency receiving circuit 2, a local oscillator 3, two digital-to-analog converter (DAC) 4 and 6, two multiplier circuits 5 and 7, a control section 8, a mixing circuit 9, an intermediate frequency amplifier circuit 10, a detection circuit 11, a low frequency amplifier 12, and a speaker 13.

The high frequency receiving circuit 2 performs high frequency amplification of a signal after tuning while performing the tuning operation of selectively passing only a component near a predetermined tuning frequency to a broadcast wave inputted from the antenna 1, and is constituted by including two high-frequency tuning circuits 20 and 24, and a high frequency amplifier 22.

Selectivity is increased by magnifying an output of a first stage of high-frequency tuning circuit 20, to which the antenna 1 is connected, by the high frequency amplifier 22, and further passing the amplified output to the second stage of high-frequency tuning circuit 24. In addition, since a variable capacitance diode for changing a tuning frequency is included in each of the two high-frequency tuning circuits 20 and 24, the tuning frequency of each of the high-frequency tuning circuits 20 and 24 is changed with interlocking, by changing a reverse bias of tuned voltage applied to the variable capacitance diode. That is, in the high frequency receiving circuit 2, a broadcast wave at a received frequency (tuning frequency) according to the tuned voltage applied to two high-frequency tuning circuits 20 and 24 is selected.

The local oscillator 3 is constituted by including a voltage controlled oscillator (VCO) 31, a frequency divider 32, a reference signal generator 33, a phase comparator 34, and a low-pass filter (LPF) 35.

The VCO 31 performs the oscillation operation of a frequency corresponding to the control voltage generated by the low-pass filter 35 to output a local oscillation signal, and comprises a VCO resonance circuit 91 and an amplifier 92. The VCO resonance circuit 91 is a parallel resonance circuit which consists of an inductor and a capacitor, and two variable capacitance diodes for making a resonance frequency variable are connected in parallel to the capacitor. Then, when the capacity of the variable capacitance diodes changes according to the reverse bias of control voltage applied, the resonance frequency of the VCO resonance circuit 91 changes. In addition, the amplifier 92 performs a predetermined magnifying operation necessary for oscillation.

The frequency divider 32 performs the frequency division of the local oscillation signal inputted from the VCO 31 by a predetermined division ratio N and outputs it. A value N of the division ratio is set as being variable by the control section 8. The reference signal generator 33 outputs a reference signal at a predetermined frequency with high frequency-stability.

The phase comparator 34 performs phase comparison between the reference signal outputted from the reference signal generator 33, and the signal (local oscillation signal after division) outputted from the frequency divider 32, and outputs a pulse-like error signal according to the phase difference. The low-pass filter 35 generates the control voltage by performing smoothing by removing a high frequency component of the pulse-like error signal outputted from the phase comparator 34. These VCO 31, frequency divider 32, phase comparator 34, and low-pass filter 35 are connected in a loop to constitute a phase synchronous loop (PLL).

In addition, the respective variable capacitance diodes included in the high-frequency tuning circuits 20 and 24 in the high frequency receiving circuit 2 mentioned above and the variable capacitance diode included in the VCO resonance circuit 91 in the local oscillator 3, which are used, have the almost same voltage vs. capacity characteristics.

The DAC 4 and multiplier circuit 5 are used for generating a tuned voltage applied to the high-frequency tuning circuit 20 in the high frequency receiving circuit 2. Specifically, the DAC 4 of this embodiment generates a voltage according to a value of the digital data inputted from the control section 8 by using a control voltage Vc outputted from the low-pass filter 35 in the local oscillator 3 as a reference voltage at the time of digital-to-analog conversion. In addition, it is made in the following explanation that the digital data inputted from the control section 8 to the DACs 4 and 6 respectively is called “DAC input data”.

When n-bit DAC input data D is inputted by the control section 8, the output voltage Va of the DAC 4 is expressed like the following formula.

$$Va=Vc\times(D/2^n) \tag{1}$$

In formula (1), supposing that the value of DAC input data D inputted into the DAC 4 is fixed to a predetermined value, the output voltage Va of the DAC 4 changes according to the control voltage Vc outputted from the low-pass filter 35. In addition, a method of setting the value of the DAC input data inputted into the DAC 4 will be described later.

The multiplier circuit 5 analog-multiplies the output voltage Va of the DAC 4 by a predetermined multiplier K. Specifically, the output voltage Vr of the multiplier circuit 5 is expressed like the following formula.

$$Vr=Va\times K \tag{2}$$

It is made that some candidate values such as "1", "1.5", and "2" are prepared as the multiplier K of this multiplier circuit 5, and hence, anyone of the values can be set arbitrarily. Then, the value of the multiplier K is set on the basis of a variable range of a frequency of the local oscillation signal, and a variable range of a received frequency in the high frequency receiving circuit 2. In this embodiment, since the frequency of the local oscillation signal outputted from the local oscillator 3 is set as a value higher by 10.7 MHz than a received frequency in the high frequency receiving circuit 2, it is necessary to set the variable range of the tuned voltage applied to the high frequency receiving circuit 2 wider than the variable range of the control voltage generated in the local oscillator 3 if it is intended to make the variable range of the received frequency and the variable range of the frequency of the local oscillation signal coincide, and hence, the multiplier circuits 5 and 7 are used. The output voltage Vr of the multiplier circuit 5 is applied to the high-frequency tuning circuit 20 as a tuned voltage Vt1.

In addition, the DAC 6 and multiplier circuit 7 are used for generating a tuned voltage applied to the high-frequency tuning circuit 24 in the high frequency receiving circuit 2. The DAC 6 outputs the output voltage Va according to the DAC input data inputted from the control section 8, and the control voltage Vc outputted from the low-pass filter 35 like the DAC 4 mentioned above. The multiplier circuit 7 analog-multiplies the output voltage Va of the DAC 6 by a predetermined multiplier K like the multiplier circuit 5 mentioned above. The output voltage Vr of the multiplier circuit 7 is applied to the high-frequency tuning circuit 24 as a tuned voltage Vt2.

The above-mentioned DACs 4 and 6 correspond to offset circuits, and the difference between the output voltage and input voltage of each of these DACs 4 and 6 corresponds to the offset voltage.

The control section 8 controls the entire operation of the FM receiver 100, and is constituted by including an MPU 81, an interface section (I/F) 82, a control section 83, and EEPROM 84.

The MPU 81 performs predetermined control operation of setting the division ratio N of the frequency divider 32 in the local oscillator 3 according to the setting value of the received frequency inputted from the operation section 83, and setting the DAC input data corresponding to each of the DACs 4 and 6.

The interface section 82 is for the connection between an external personal computer (PC) 128 and the MPU 81 in the control section 8. Various commands can be given from the PC 128 to the MPU 81 through this interface section 82.

The operation section 83 is equipped with various kinds of operation keys, and is used for the setting of the received frequency, and the like. The EEPROM 84 is memory which can perform the storage and erase of data electrically, and stores the DAC input data necessary for generating a predetermined offset voltage.

The mixing circuit 9 mixes a received signal, which is outputted from the high frequency receiving circuit 2, and a local oscillation signal outputted from the local oscillator 3, and outputs a signal corresponding to a differential component thereof.

The intermediate frequency amplifier circuit 10 generates an intermediate frequency signal by passing only the frequency component near the predetermined intermediate frequency (10.7 MHz) while magnifying the signal outputted from the mixing circuit 9.

The detection circuit 11 performs the detection processing of the intermediate frequency signal outputted from the intermediate frequency amplifier circuit 10, and demodulates a sound signal. The low frequency amplifier 12 amplifies the sound signal outputted from the detection circuit 11 at a predetermined gain. The speaker 13 performs a voice output on the basis of the sound signal after the amplification which is outputted from the low frequency amplifier 12.

A test signal input terminal 14 is provided for inputting a test signal at a predetermined frequency for performing tracking adjustment. The test signal inputted through this test signal input terminal 14 is inputted into the high frequency receiving circuit 2.

In addition, each of the distortion meter 120, level meter 122, test signal generator 126, and PC 128 which are shown in FIG. 1 is used for performing the predetermined tracking adjustment which sets a value of the DAC input data inputted into the DACs 4 and 6 in the FM receiver 100 mentioned above.

The distortion meter 120 measures a distortion rate based on the sound signal after the amplification which is outputted from the low frequency amplifier 12 in the FM receiver 100. The level meter 122 measures a signal level of the sound signal after the amplification which is outputted from the low frequency amplifier 12.

Figure 2:
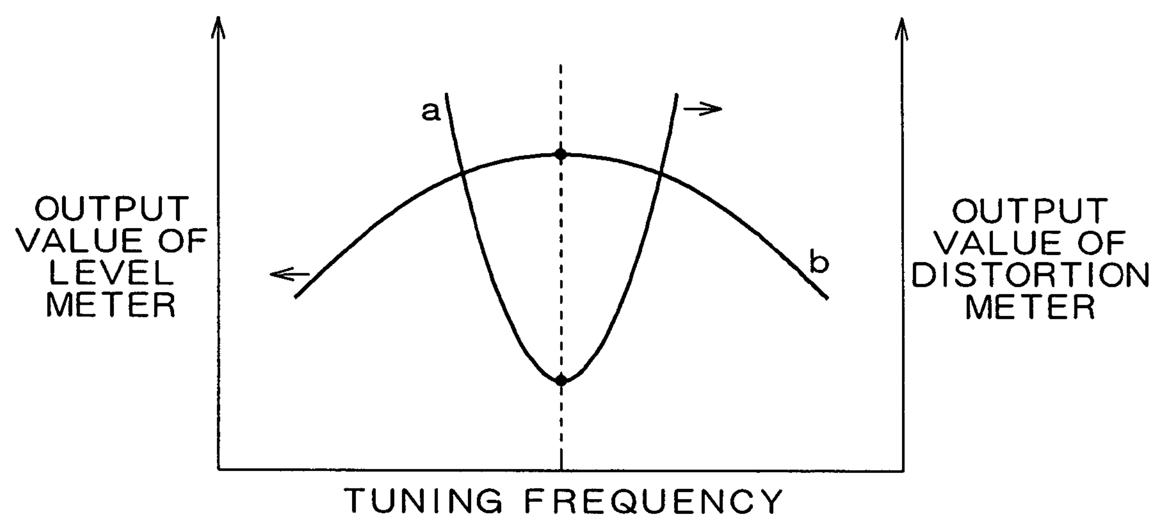
FIG. 2 is a graph showing the relationship between the output values of a distortion meter and a level meter, and the tuning point.

FIG. 2 is a graph showing the relationship between the output values of the distortion meter 120 and level meter 122, and the tuning point. In this diagram, the horizontal axis corresponds to the tuning frequency, the left-hand side vertical axis corresponds to the output value of the level meter 122, and the right-hand side vertical axis corresponds to the output value of the distortion meter 120, respectively. In addition, a curve a shows the changing state of the output value of the distortion meter 120, and a curve b shows the changing state of the output value of the level meter 122, respectively.

As shown in FIG. 2, at an optimum tuning point shown by a dotted line near the center, the output value (distortion rate) of the distortion meter 120 becomes at a minimum, and, the output value of the level meter 122 becomes at a maximum. Hence, in order to investigate a tuned voltage corresponding to the optimum tuning point, what is necessary is just to detect the tuned voltage that the output value of the level meter 122 becomes at a maximum, but the changing degree near the tuning point of the output value of the level meter 122 is gentle, and hence, it is not easy to extract the optimum tuning point. For this reason, usually, the tuned voltage that the output value of the distortion meter 120 becomes at a minimum is detected, which is set as the tuned voltage corresponding to the optimum tuning point. However, since the output value of the distortion meter 120 becomes at a minimum also in a non-signal status, it is also necessary to refer to the output value of the level meter 122 not to detect an incorrect tuning point in such a status.

The test signal generator 126 outputs the test signal generated by applying FM modulation to a carrier at a predetermined frequency on the basis of a command from the PC 128. This test signal is inputted into the high frequency amplifier 2 in the FM receiver 100 through the test signal input terminal 14 mentioned above.

The PC 128 controls consecutive operation for performing the tracking adjustment. Specifically, the PC 128 sets the received frequency of the FM receiver 100 at the frequency of a test signal by setting the division ratio of the frequency divider 32 in the local oscillator 3 as a predetermined value while sending a command to the test signal generator 126 and inputting the predetermined test signal into the FM receiver 100. In addition, in this status, the PC 128 reads each output value of the distortion meter 120 and level meter 122 with changing a value of the DAC input data inputted into the DACs 4 and 6 respectively, and measures the DAC input data at the time when the output value of the level meter 122 is a predetermined value or higher, and the output value of the distortion meter 120 becomes at a minimum. The DAC input data obtained for by this measurement is sent to the control section 8 of the FM receiver 100, and is stored in the EEPROM 84 by the MPU 81. The MPU 81 mentioned above corresponds to the voltage value setting unit. The detailed procedure of the tracking adjustment will be described later.

The FM receiver 100 of this embodiment has such structure, and next, the detail of the tracking adjustment operation performed by the PC 128 will be explained.

Figure 3:
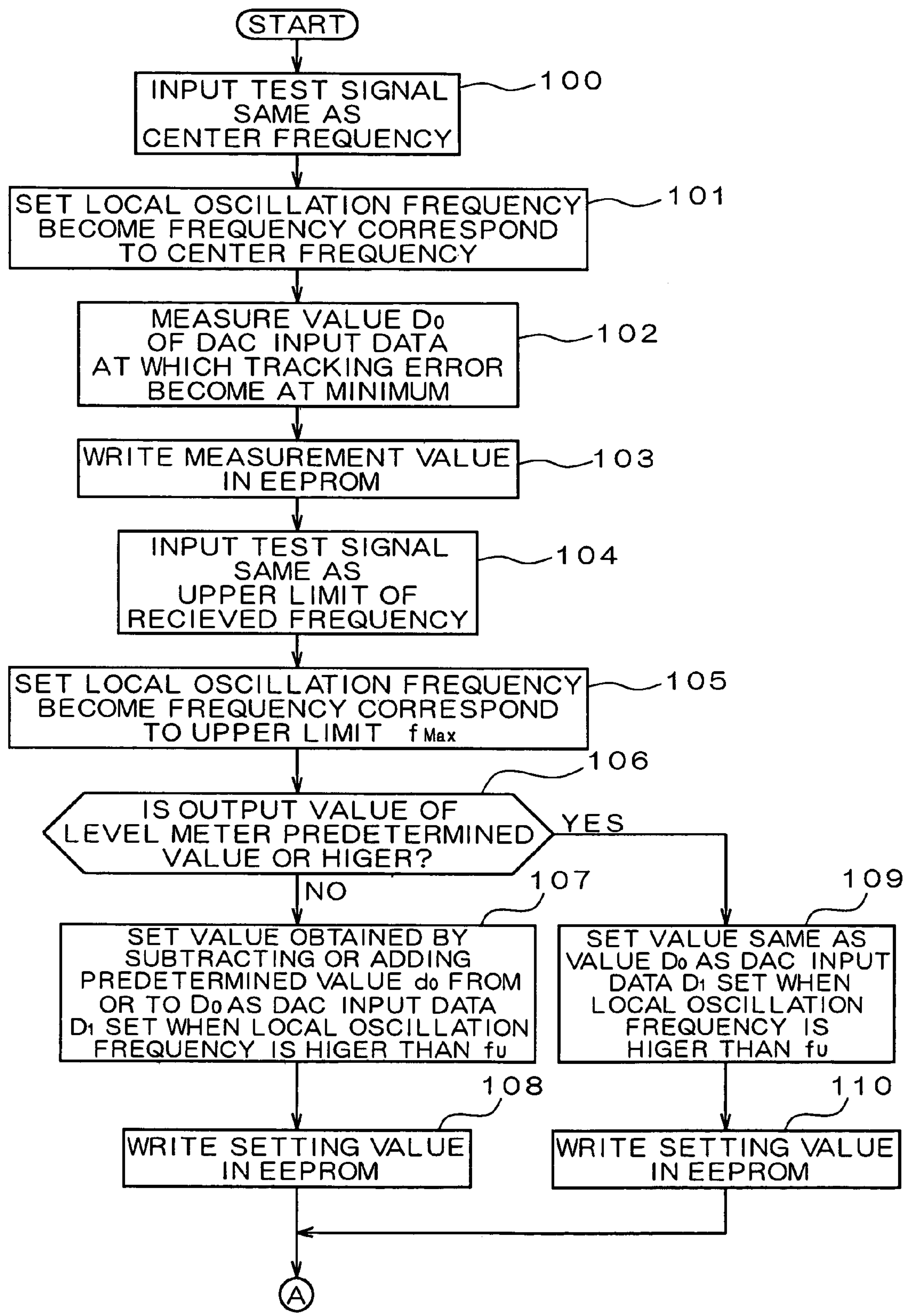
FIG. 3 is a flowchart showing the operation procedure of tracking adjustment performed by PC control.
Figure 4:
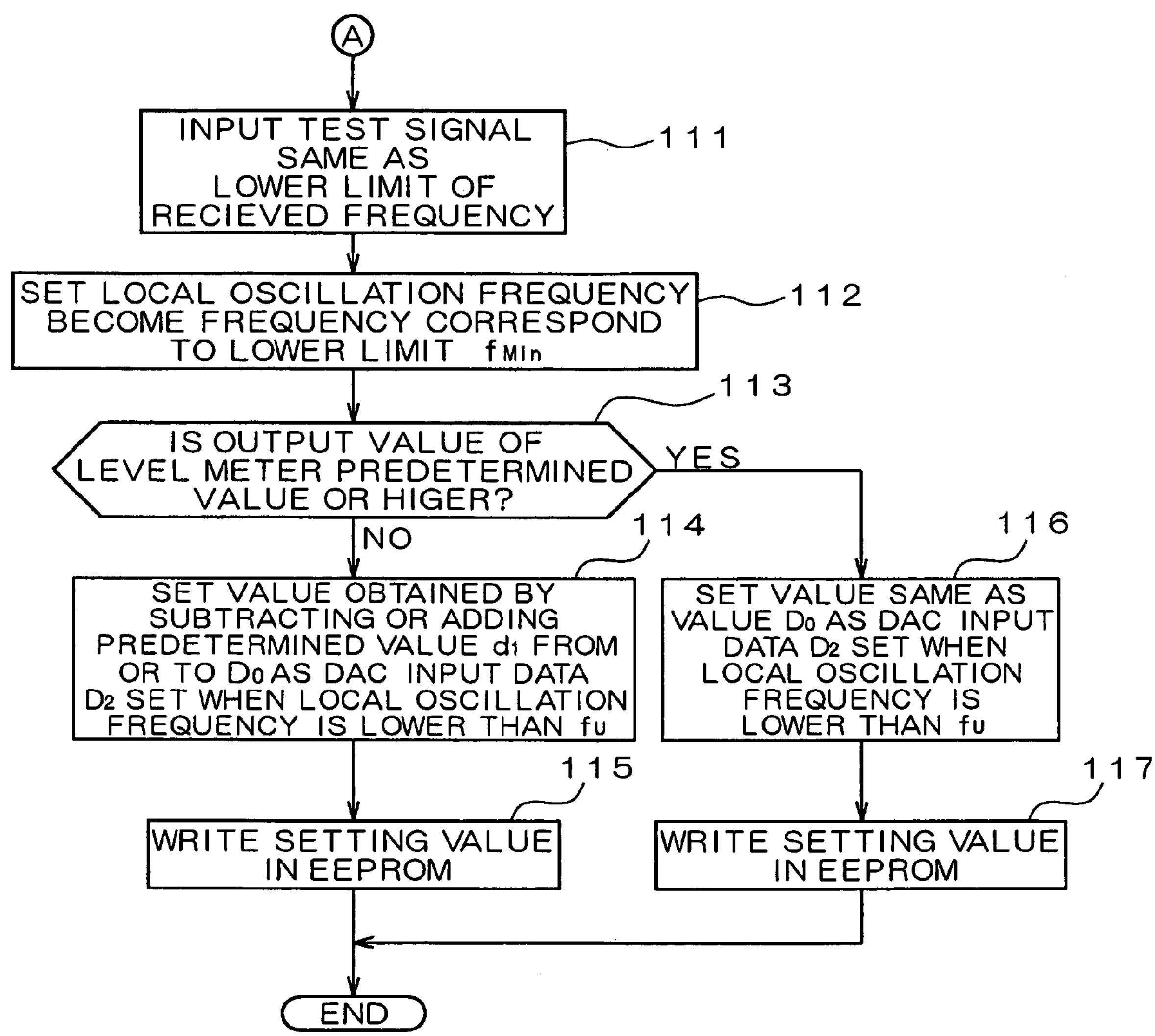
FIG. 4 is a flowchart showing the operation procedure of tracking adjustment performed by PC control.

FIGS. 3 and 4 are flowcharts showing the operation procedure of the tracking adjustment performed by the control of the PC 128. In addition, since the FM receiver 100 of this embodiment includes two DACs 4 and 6 which become objects of the tracking adjustment, the case that the tracking adjustment is performed will be explained with paying attention to any one of the DACs.

First, the PC 128 sends a command to the test signal generator 126 to input the test signal at the same frequency as the center frequency of the variable range of the received frequency of the FM receiver 100 into the FM receiver 100 (step 100). For example, supposing that the received frequency band of the FM receiver 100 is 76.0 to 90.0 MHz, the test signal at 83.0 MHz which is the same frequency as the center frequency of this variable range is generated by the test signal generator 126, and is inputted into the test signal input terminal 14 of the FM receiver 100.

In addition, the PC 128 sends a command to the control section 8 to set such that the oscillation frequency (local oscillation frequency) of the local oscillator 3 may become a frequency corresponding to the center frequency of the variable range of the received frequency of the FM receiver 100 (step 101). For example, supposing that in the FM receiver 100 of this embodiment a local oscillation signal with a frequency higher by 10.7 MHz than the received frequency is used, the division ratio of the frequency divider 32 necessary for generating the local oscillation frequency of 93.7 MHz is set.

Thus, after the input of the test signal and the setting of the local oscillation frequency are finished, next, the PC 128 changes the value of the DAC input data corresponding to one side of DAC 4 within the predetermined range, and measures a value $D_0$ of the DAC input data at which the tracking error becomes at a minimum (step 102) to write this measurement value in the EEPROM 84 in the control section 8 (step 103). As mentioned above, since the output value of the distortion meter 120 also becomes at a minimum when the tracking error becomes at a minimum by the optimum tuning point being set, the PC 128 changes the value of the DAC input data in one direction and measures the value of the DAC input data at which the output value of this distortion meter 120 becomes at a minimum. In addition, at this time, the PC 128 verifies that the output value of the level meter 122 is the predetermined value or higher, and if being less than the predetermined value, it performs predetermined error display.

Figure 5:
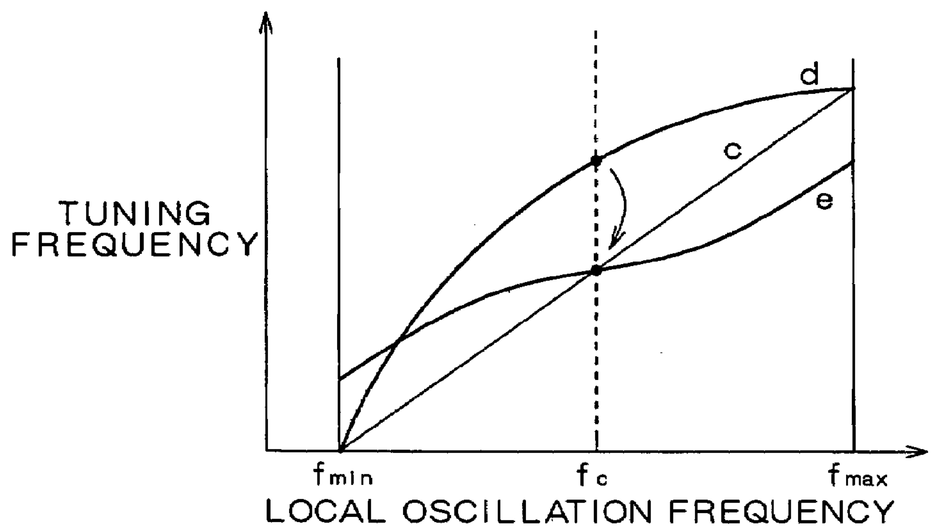
FIG. 5 is a graph showing the relationship between the local oscillation frequency and the tuning frequency.

FIG. 5 is a graph showing the relationship between the local oscillation frequency and the tuning frequency. When there is no tracking error in the entire area of the receiving band, the tuning frequency is set at a frequency lower by 10.7 MHz than this when the local oscillation frequency is changed, and hence, the local oscillation frequency and the tuning frequency become the relationship shown by a straight line c in FIG. 5. However, generally, since a tracking error caused by respective circuit configuration of the local oscillator 3 and high frequency receiving circuit 2, the difference between the oscillation frequency and tuning frequency, etc. arises, they have the relationship of a curve d different from the straight line c mentioned above.

Since the DAC input data $D_0$ which makes the output value of the distortion meter 120 at a minimum when a local oscillation frequency is set at the center frequency of a variable range is measured in the measurement at step 102 mentioned above, it is possible to minimize the tracking error corresponding to this local oscillation frequency and tuning frequency by applying an output voltage to the high-frequency tuning circuit 20 as the tuned voltage Vt1 after passing the voltage, generated by the DAC 4 in correspondence to this DAC input data $D_0$, to the multiplier circuit 5. That is, it is possible to fulfill the relationship between the local oscillation frequency and tuning frequency as shown by a curve e in FIG. 5 by executing the measurement at step 102 and setting the value of the DAC input data corresponding to the DAC 4.

Next, the PC 128 investigates whether a tracking error becomes a predetermined value or lower over the entire receiving band, and when the tracking error becomes large in some frequency band, it changes the value of the DAC input data in the frequency range in which this band is included.

Specifically, first, the PC 128 sends a command to the test signal generator 126 to input the test signal at the same frequency as the upper limit of the variable range of the received frequency of the FM receiver 100 into the FM receiver 100 (step 104). In addition, the PC 128 sends a command to the control section 8 to set a value of the local oscillation frequency so that it may become a frequency corresponding to the upper limit fmax of the variable range of the local oscillation frequency (step 105).

Thus, after various kinds of settings corresponding to the upper limit of the received frequency are finished, the PC 128 fetches the output value of the level meter 122, and determines whether this value is the predetermined value or higher (step 106). Thus, in this embodiment, it is determined in the upper limit of the received frequency by investigating the output value of the level meter 122 whether the tracking error is included in the tolerance of being a predetermined value or less. Although the change of the output value of the level meter 122 becomes gentle near the optimum tuning point as shown in FIG. 2, the output value of the level meter 122 greatly drops as being separates from the optimum tuning point, and hence, it is possible to easily determine whether the tracking error becomes large with exceeding the tolerance, only by referring to only the output value of this level meter 122.

When the tracking error becomes large and the output value of the level meter 122 drops to the predetermined value or lower, negative judgment is performed in the determination at step 106, and next, the PC 128 sets a value obtained by subtracting or adding the predetermined value $d_0$ from or to the DAC input data $D_0$ corresponding to a median fc mentioned below (step 107) as the DAC input data $D_1$ set when the local oscillation frequency is higher than an upper mean value fu corresponding to the almost middle between the median fc of the variable range, and the upper limit fmax, and writes this setting value in the EEPROM 84 in the control section 8 (step 108).

In addition, since such a value of do that the tracking error may become a predetermined value or less in the upper limit fmax of the variable range of the local oscillation frequency is calculated beforehand by inputting the DAC input data $D_1$, obtained by addition or subtraction of this predetermined value $d_0$, instead of the DAC input data $D_0$ into the DAC 4, it is made to be able to suppress the tracking error in the range from the median fc to the upper limit value fmax to the predetermined value or less only by changing the value of the DAC input data into $D_1$ from $D_0$ at the frequency in a predetermined range including this upper limit fmax when the tracking error in the upper limit fmax is large.

Furthermore, when the tracking error corresponding to the upper limit fmax of the local oscillation frequency is small and the output value of the level meter 122 is the predetermined value or higher, affirmative judgment is performed in the determination at step 106, and next, the PC 128 sets the value same as the DAC input data $D_0$ corresponding to the median fc, mentioned above, as the DAC input data $D_1$ set when the local oscillation frequency is higher than the upper mean value $f_u$ corresponding to the almost middle between the median fc of its variable range and the upper limit fmax (step 109) to write this setting value in the EEPROM 84 in the control section 8 (step 110).

Thus, when the setting processing of the DAC input data corresponding to the upper limit fmax of the local oscillation frequency is finished, the setting processing of the DAC input data corresponding to the lower limit fmin of the local oscillation frequency is performed in the same way. That is, the PC 128 sends a command to the test signal generator 126 to input the test signal at the same frequency as the lower limit of the variable range of the received frequency of the FM receiver 100 into the FM receiver 100 (step 111). In addition, the PC 128 sends a command to the control section 8 to set the local oscillation frequency so that it may become a frequency corresponding to the lower limit fmin of the variable range of the local oscillation frequency (step 112).

Thus, after various kinds of settings corresponding to the lower limit of the received frequency are finished, the PC 128 fetches the output value of the level meter 122, and determines whether this value is the predetermined value or higher (step 113). When the tracking error becomes large and the output value of the level meter 122 drops to the predetermined value or lower, negative judgment is performed in the determination at step 113, and next, the PC 128 sets a value obtained by subtracting or adding the predetermined value $d_1$ from or to the DAC input data $D_0$ corresponding to a median fc mentioned below (step 114) as the DAC input data $D_2$ set when the local oscillation frequency is lower than a lower mean value $f_L$ corresponding to the almost middle between the median fc of the variable range, and the lower limit fmin, and writes this setting value in the EEPROM 84 in the control section 8 (step 115).

Furthermore, since such a value of $d_1$ that the tracking error may become a predetermined value or less in the lower limit fmin of the variable range of the local oscillation frequency is calculated beforehand by inputting the DAC input data $D_2$, obtained by addition or subtraction of this predetermined value $d_1$, instead of the DAC input data $D_0$ into the DAC 4 similarly to the addition or subtraction value $d_0$, it is made to be able to suppress the tracking error in the range from the median fc to the lower limit fmin to the predetermined value or less only by changing the value of the DAC input data into $D_2$ from $D_0$ at the frequency in a predetermined range including this lower limit fmin when the tracking error in the lower limit fmin is large.

In addition, when the tracking error corresponding to the lower limit fmin of the local oscillation frequency is small and the output value of the level meter 122 is the predetermined value or higher, affirmative judgment is performed in the determination at step 113, and next, the PC 128 sets the value same as the DAC input data $D_0$ corresponding to the median fc, mentioned above, as the DAC input data $D_2$ set when the local oscillation frequency is lower than the lower mean value $f_L$ corresponding to the almost middle between the median fc of its variable range and the lower limit fmin (step 116) to write this setting value in the EEPROM 84 in the control section 8 (step 117).

Figure 6:
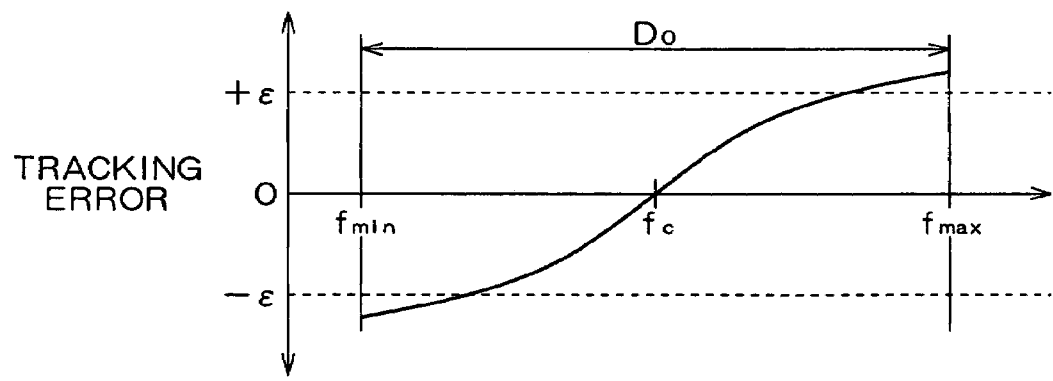
FIG. 6 is a graph showing the relationship between the variable range of a local oscillation frequency, and the tracking error.
Figure 7:
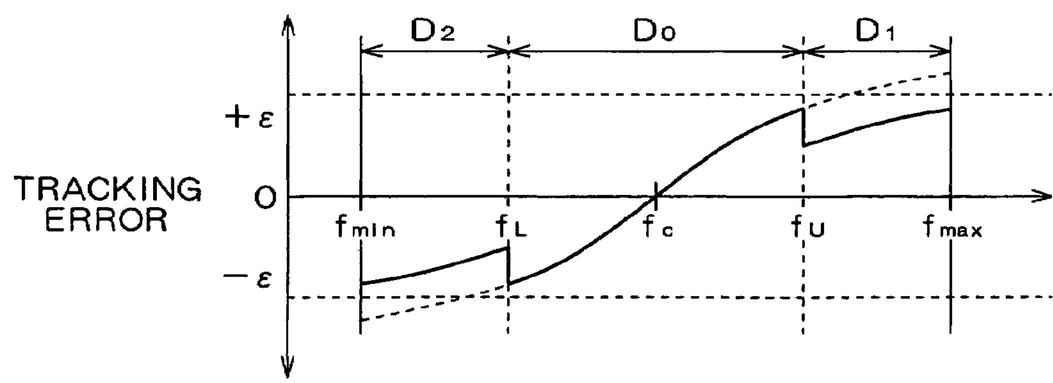
FIG. 7 is a graph showing the relationship between the variable range of a local oscillation frequency, and the tracking error.
Figure 8:
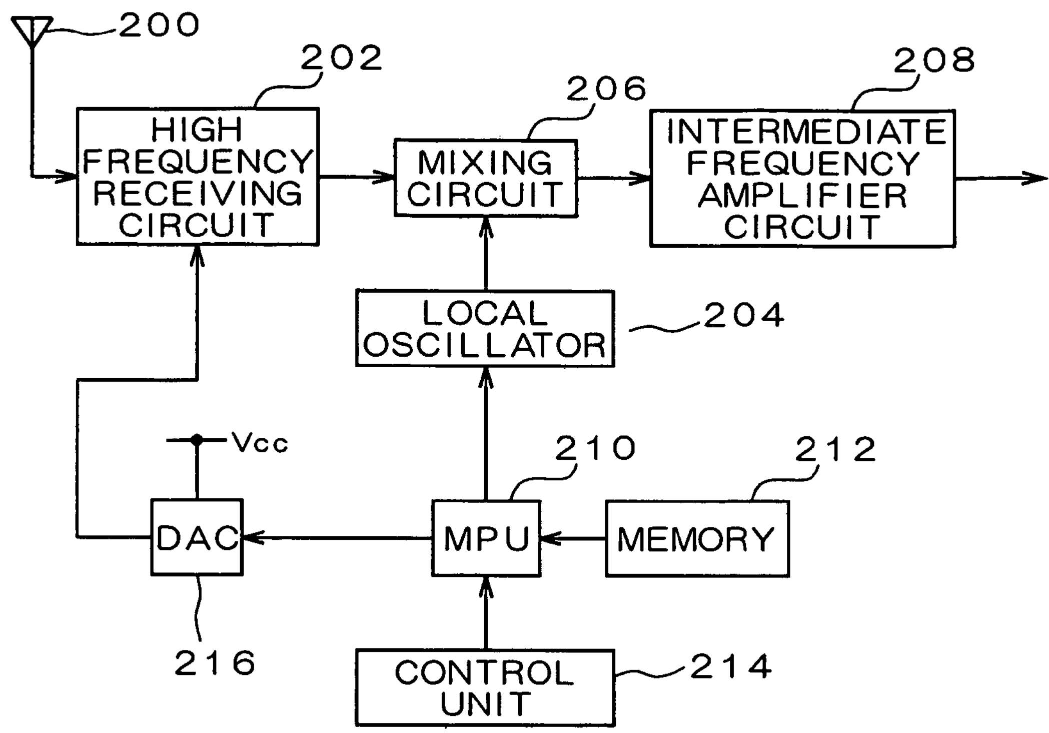
FIG. 8 is a diagram showing the structure of a conventional receiver which adopts a superheterodyne system.
Figure 9:
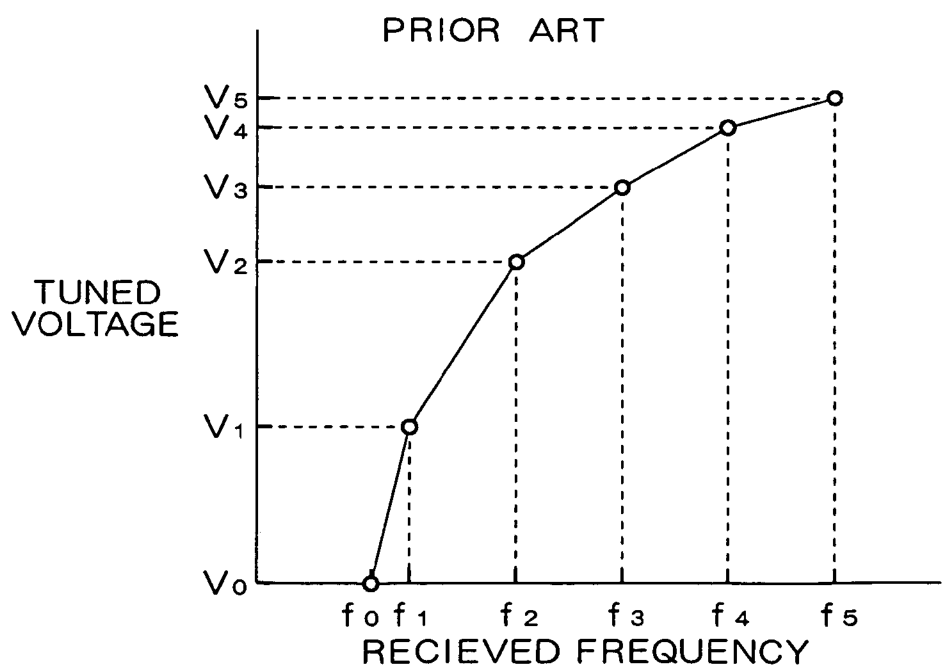
FIG. 9 is a graph showing contents of data stored in memory.

FIGS. 6 and 7 are graphs showing the relationship between the variable range of the local oscillation frequency and the tracking error in the FM receiver 100 of this embodiment.

As shown in FIG. 6, in the median fc of the local oscillation frequency, since the adjustment is performed so that the tracking error may become at a minimum, and the DAC input data $D_0$ which is inputted into the DACs 4 and 6 is set, the tracking error in this frequency hardly exists. In addition, as the difference between this median fc and the actual local oscillation frequency becomes large, the tracking error also becomes large. Then, as shown in FIG. 6, when the tracking error in the upper limit fmax or lower limit fmin of the local oscillation frequency exceeds the predetermined value $\epsilon$, the DAC input data $D_1$ and $D_2$ whose values are different from the DAC input data $D_0$ corresponding to the frequency range including the median fc is set in the frequency range in or above the upper mean value $f_u$ or the frequency range in or below the lower mean value $f_L$, and hence, the tracking adjustment is made so that the tracking error in these respective frequency ranges may become below or at the predetermined value $\epsilon$ as shown in FIG. 7.

Thus, since the tracking adjustment of the FM receiver 100 of this embodiment is just to perform the measurement using the distortion meter 120 and level meter 122 at the median fc of the local oscillation frequency, it becomes possible to sharply shorten measuring time by reducing the number of times of the distortion rate measurement which requires comparatively long time for measurement.

Next, the operation in the case of receiving an FM broadcasting wave by using the FM receiver 100 which is given the tracking adjustment in this way will be simply explained. When a predetermined power switch (not shown) is operated and the FM receiver 100 is in an operable status, the MPU 81 in the control section 8 determines whether the operation section 83 is operated and the modification of a received frequency is commanded. When the modification of the received frequency is commanded, the MPU 81 calculates a division ratio of the frequency divider 32 necessary for generating the local oscillation frequency corresponding to s received frequency after the change, and sets this calculated division ratio to the frequency divider 32. In addition, the MPU 81 determines whether the local oscillation frequency corresponding to the received frequency after this change belongs to which frequency band shown in FIG. 7, and inputs into each of the DACs 4 and 6 either of the corresponding DAC input data $D_0$, $D_1$, and $D_2$.

Owing to this, since the tracking error at the time when an FM broadcasting wave at a new received frequency is received is suppressed below or at a predetermined value, it is possible to maintain a good receiving status in the entire area of a receiving band.

In particular, in the FM receiver 100 of this embodiment, the VCO resonance circuit 91 included in the local oscillator 3 and two high-frequency tuning circuits 20 and 24 included in the high frequency receiving circuit 2 are achieved in similar structure, and further, when the control voltage Vc generated in the local oscillator 3 changes, the tuned voltages Vt1 and Vt2 applied to the respective high-frequency tuning circuits 20 and 24 also change with interlocking with this, and hence, the change of the tuning frequency is suppressed. For this reason, a specific temperature compensation circuit becomes unnecessary. In addition, since operating with the control voltage Vc applied from the local oscillator 3 as a reference voltage, each of the DACs 4 and 6 is not influenced even if a supply voltage of the FM receiver 100 is unstable, and hence, it is possible to prevent the increase of the tracking error by the fluctuation of the supply voltage.

In addition, the present invention is not limited to the above-mentioned embodiments, but various modified implementation is possible within the scope of the gist of the present invention. For example, in the embodiment mentioned above, when the tracking error measured on the basis of the output value of the level meter 122 exceeds a predetermined value in the upper limit fmax or lower limit fmin of the local oscillation frequency, the DAC input data $D_1$ and $D_2$ which is obtained so that the tracking error may become below or at the predetermined value beforehand is used instead of the DAC input data $D_0$ set in correspondence to the median fc of the local oscillation frequency, but it is also good to measure each time an adequate value of the DAC input data at which the tracking error becomes the predetermined value or less by changing the value of the DAC input data with monitoring an amount of the tracking error by acquiring the output value of the level meter 122 at these upper limit fmax or lower limit fmin.

Furthermore, although the value of the DAC input data is changed only once from $D_0$ to $D_1$ or from $D_0$ to $D_2$ in the embodiment mentioned above according to necessity when the local oscillation frequency is higher than the upper mean value $f_u$, or is lower than the lower mean value $f_L$, it is also good to change the value of the DAC input data twice or more in each.

Moreover, although the case that the tracking adjustment of the FM receiver 100 is performed is explained in the embodiment mentioned above, the present invention is applicable also to other receivers adopting a superheterodyne system, such as an AM receiver, a television set, and a cellular phone.

In addition, although the tuned voltages Vt1 and Vt2 which are applied to two high-frequency tuning circuits 20 and 24 in the high frequency receiving circuit 2 respectively are separately generated in the embodiment mentioned above, it is also good to set each tuning frequency by using a common tuned voltage Vt1 by adjusting device constants of components in the two high-frequency tuning circuits 20 and 24. In this case, since time and effort necessary for the tracking adjustment also becomes about half while the simplification of circuit configuration is attained since the DAC 6 and multiplier circuit 7 become unnecessary, it becomes possible to sharply reduce the adjustment work hours performed in the production process of the FM receiver 100.

Furthermore, although the value of the DAC input data $D_0$ at which the tracking error becomes at a minimum is obtained by setting the local oscillation frequency at the median fc and performing measurement using the distortion meter 120 and level meter 122 when the tracking adjustment is performed in the embodiment mentioned above, the setting value of the local oscillation frequency is not limited to the median fc, but it is also good to set it at an arbitrary value included in a variable frequency range except this. Specifically, depending on the characteristics of the variable capacitance diodes included in the high-frequency tuning circuits 20 and 24 or the VCO resonance circuit 91, as shown in FIG. 6, when it is made that an amount of the tracking error in the upper limit fmax of the local oscillation frequency and an amount of the tracking error in the lower limit fmin become equal, a frequency at which an amount of the tracking error becomes zero may shift from the median fc of the local oscillation frequency. In such a case, by setting the local oscillation frequency at a value which is shifted by a predetermined amount from the median fc in the upper or lower side to perform the tracking adjustment, it is possible to obtain an adequate value of the DAC input data $D_0$ by which it is possible to further lessen the tracking error throughout the variable range of the local oscillation frequency.

INDUSTRIAL APPLICABILITY

As mentioned above, according to the receiver of the present invention, since the tuned voltage is generated on the basis of the control voltage, it is not necessary to obtain a plurality of tuned voltages, at which a tracking error becomes at a minimum, by measurement like a conventional receiver using a digital-to-analog converter, and hence, it is possible to shorten the time necessary for tracking adjustment.

In addition, according to a tracking adjusting method of a receiver of the present invention, since the measurement of a tracking error is executed at an substantially center value of the variable range of a received frequency, it is possible to shorten the time necessary for the tracking adjustment by reducing the number of times of this measurement.

The invention claimed is:

1. A tracking adjusting method of performing tracking adjustment of a receiver which comprises:

a high frequency receiving circuit receiving a broadcast wave at a received frequency according to a tuned voltage;

a local oscillator generating a local oscillation signal at a frequency according to a control voltage;

a mixing circuit mixing a signal, which is outputted from the high frequency receiving circuit, and the local oscillation signal, and outputting an intermediate frequency signal corresponding to a differential frequency thereof;

an offset circuit setting a predetermined offset voltage to the control voltage; and a multiplier circuit performing analog multiplication of a predetermined multiplier to the control voltage, and applies a voltage, which is the control voltage passed through the offset circuit and the multiplier circuit, as the tuned voltage to the high frequency receiving circuit, the tracking adjusting method of a receiver characterized in comprising:

a first step of setting a received frequency of the receiver at an arbitrary value included in its variable range and inputting a predetermined test signal having the same frequency as the received frequency at this time into the high frequency receiving circuit; and a second step of setting a value of the offset voltage set by the offset circuit so that a tracking error of the receiver after various kinds of settings being performed at the first step may become at a minimum.

2. The tracking adjusting method of a receiver according to claim 1, characterized in comprising a third step of changing and setting a value of the offset voltage in regard to some frequency band in which these upper limit or lower limit is included when a tracking error near the upper limit or lower limit of the variable range is large.

3. A tracking adjusting method of performing tracking adjustment of a receiver which comprises:

a high frequency receiving circuit receiving a broadcast wave at a received frequency according to a tuned voltage;

a local oscillator generating a local oscillation signal at a frequency according to a control voltage;

a mixing circuit mixing a signal, which is outputted from the high frequency receiving circuit, and the local oscillation signal, and outputting an intermediate frequency signal corresponding to a differential frequency thereof;

a digital-to-analog converter which sets the offset voltage by adjusting input data while using the control voltage as a reference voltage;

a multiplier circuit performing analog multiplication of a predetermined multiplier to the control voltage;

memory which stores the input data necessary for generation of the offset voltage set so that a tracking error corresponding to the entire area of a variable range of a frequency of the local oscillation signal may become a predetermined value or less; and a voltage value setting unit which sets a value of the offset voltage corresponding to a frequency of the local oscillation signal by reading the input data stored in the memory, and inputting it into the digital-to-analog converter, and applies a voltage, which is the control voltage passed through the digital-to-analog converter and the multiplier circuit, as the tuned voltage to the high frequency receiving circuit, the tracking adjusting method of a receiver characterized in comprising:

a fourth step of setting a received frequency of the receiver at an arbitrary value included in its variable range and inputting a predetermined test signal having the same frequency as the received frequency at this time into the receiver;

a fifth step of setting input data of the digital-to-analog converter so that a tracking error of the receiver after various kinds of settings being performed at the fourth step may become at a minimum; and a sixth step of storing the input data, set at the fifth step, in the memory.

4. The tracking adjusting method of a receiver according to claim 3, characterized in comprising:

a seventh step of changing and setting contents of input data of the digital-to-analog converter in regard to some frequency band in which these upper limit or lower limit is included when a tracking error near the upper limit or lower limit of the variable range is large; and an eighth step of storing input data of the digital-to-analog converter after change, set at the seventh step, in the memory.

* * * * *